US012581832B2

(12) United States Patent
Dai et al.

(10) Patent No.: US 12,581,832 B2
(45) Date of Patent: Mar. 17, 2026

(54) DISPLAY PANEL AND MOTHERBOARD STRUCTURE, DISPLAY DEVICE

(71) Applicants: Chengdu BOE Optoelectronics Technology Co., Ltd., Chengdu (CN); BOE Technology Group Co., Ltd., Beijing (CN)

(72) Inventors: Junxiu Dai, Beijing (CN); Lu Bai, Beijing (CN); Yang Zhou, Beijing (CN); Yi Qu, Beijing (CN); Siyu Wang, Beijing (CN); Song Liu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 347 days.

(21) Appl. No.: 18/267,780

(22) PCT Filed: Mar. 7, 2022

(86) PCT No.: PCT/CN2022/079573
§ 371 (c)(1),
(2) Date: Jun. 16, 2023

(87) PCT Pub. No.: WO2023/168563
PCT Pub. Date: Sep. 14, 2023

(65) Prior Publication Data
US 2024/0423066 A1 Dec. 19, 2024

(51) Int. Cl.
*H10K 59/80* (2023.01)
(52) U.S. Cl.
CPC .............................. *H10K 59/8722* (2023.02)

(58) Field of Classification Search
CPC .. H10K 59/8722; H10K 59/00; H10K 59/131; H10K 71/851; G02F 1/1333; G09F 9/33
See application file for complete search history.

(56) References Cited

U.S. PATENT DOCUMENTS

| | | | |
|---|---|---|---|
| 11,062,630 B2 | 7/2021 | Wu | |
| 2020/0136087 A1* | 4/2020 | Kim | .................... H10K 59/122 |
| 2020/0410913 A1 | 12/2020 | Wu | |

FOREIGN PATENT DOCUMENTS

| | | |
|---|---|---|
| CN | 109872634 A | 6/2019 |
| CN | 110391350 A | 10/2019 |

(Continued)

OTHER PUBLICATIONS

International Search Report and Written Opinion mailed on Nov. 11, 2022, in corresponding PCT/CN2022/079573, 6 pages.

*Primary Examiner* — James R Greece
*Assistant Examiner* — Jose M Diaz
(74) *Attorney, Agent, or Firm* — XSENSUS LLP

(57) ABSTRACT

The present disclosure provides a display panel (PNL), a motherboard structure, and a display device, and belongs to the field of display technologies. The display panel (PNL) has a display area (AA) and a peripheral area (BB) surrounding the display area (AA); and the peripheral area (BB) has an inner cut line (ICUT) surrounding the display area (AA). The motherboard structure includes a plurality of display panels (PNL), and the motherboard structure has a main cut line (MCUT) between the display panels (PNL). An outer cut line (OCUT) is disposed in at least a partial area between the main cut line (MCUT) and the inner cut line (ICUT) of the display panel (PNL); an end of the outer cut line (OCUT) is intersected with the inner cut line (ICUT); and a second crack dam (DAM2) is disposed between the outer cut line (OCUT) and the inner cut line (ICUT).

18 Claims, 9 Drawing Sheets

(56) References Cited

FOREIGN PATENT DOCUMENTS

| CN | 111146211 | A | 5/2020 |
| CN | 111965870 | A | 11/2020 |
| CN | 113555374 | A | 10/2021 |
| CN | 113888971 | A | 1/2022 |
| WO | 2021/136515 | A1 | 7/2021 |

* cited by examiner

DISPLAY PANEL AND MOTHERBOARD STRUCTURE, DISPLAY DEVICE

CROSS-REFERENCE TO RELATED APPLICATION

The present application is based upon International Application No. PCT/CN2022/079573, filed on Mar. 7, 2022, and the entire contents thereof are incorporated herein by reference.

TECHNICAL FIELD

The present disclosure relates to the field of display technologies, in particular, to a display panel, a motherboard structure, and a display device.

BACKGROUND

With the development of display technologies, people have increasingly personalized demands on appearances of display devices. During the design of display panels, a plurality of cut lines can be provided at local positions of motherboard structures, so that display panels of different shapes can be manufactured by selecting the cut lines.

It should be noted that the information disclosed in the Background section above is only for enhancing the understanding of the background of the present disclosure, and thus may include information that does not constitute prior art known to those of ordinary skill in the art.

SUMMARY

The present disclosure provides a display panel, a motherboard structure, and a display device.

According to an aspect of the present disclosure, there is provided a display panel, including a display area and a peripheral area surrounding the display area; wherein the peripheral area has an inner cut line surrounding the display area and a first crack dam located at a side of the inner cut line close to the display area.

According to an embodiment of the present disclosure, the display panel further has an outer cut line located on a side of the inner cut line away from the display area in at least a partial area of the peripheral area; and an end of the outer cut line is intersected with the inner cut line.

According to an embodiment of the present disclosure, the side of the inner cut line away from the display area is provided with an identification mark; and at least part of the identification mark is at least partially disposed within the outer cut line.

According to an embodiment of the present disclosure, a second crack dam is disposed between the identification mark and the inner cut line.

According to an embodiment of the present disclosure, a side of the inner cut line away from the display area is provided with an identification mark; and at least part of the identification mark is located between the outer cut line and the inner cut line, and a width of a part of the outer cut line close to the identification mark is smaller than a width of a remaining part of the outer cut line; and the second crack dam is disposed between the identification mark and the inner cut line.

According to an embodiment of the present disclosure, a plurality of second crack dams are provided; and a crack blocking groove is disposed between two adjacent second crack dams, and the crack blocking groove is filled with an organic material.

According to an embodiment of the present disclosure, the display panel includes an organic substrate, an inorganic material layer and an organic material layer sequentially stacked in an area where the second crack dams are located; and a bottom of at least one of the crack blocking grooves is located at the inorganic material layer.

According to an embodiment of the present disclosure, the display panel includes an organic substrate, an inorganic material layer and an organic material layer sequentially stacked in an area where the second crack dams are located; and a bottom of at least one of the crack blocking grooves is located at the organic substrate.

According to an embodiment of the present disclosure, the inorganic material layer includes an inorganic blocking layer, an inorganic buffer layer, a gate insulating layer and an interlayer dielectric layer sequentially stacked on a side of the organic substrate; and a bottom of the crack blocking groove is located at the inorganic buffer layer, the inorganic blocking layer or the organic substrate.

According to an embodiment of the present disclosure, the number of the second crack dams is in a range of 2-8.

According to an embodiment of the present disclosure, a width of the second crack dam is in a range of 5-15 microns.

According to an embodiment of the present disclosure, a width of the crack blocking groove is in the range of 5-10 microns.

According to an embodiment of the present disclosure, a ratio of the width of the second crack dam to the width of the crack blocking groove is between 0.8 and 1.2.

According to an embodiment of the present disclosure, the peripheral area includes a first peripheral area, a second peripheral area, a third peripheral area and a fourth peripheral area that surround the display area and are sequentially coupled end to end; the first peripheral area is disposed opposite to the third peripheral area; and the first peripheral area has a bonding pad for bonding an external circuit; and the outer cut line is disposed at the first peripheral area and/or the third peripheral area.

According to an embodiment of the present disclosure, the display panel has a rounded corner; and at least one edge of the rounded corner is partially overlapped with the outer cut line.

According to an embodiment of the present disclosure, a plurality of outer cut lines are provided and arranged in sequence along a direction away from the display area in at least a partial area; and the second crack dam is disposed between the outer cut line closest to the display area and the inner cut line.

According to an embodiment of the present disclosure, the display panel is provided with a crack detection trace in the peripheral area; and the crack detection trace is disposed between the first crack dam and the display area.

According to another aspect of the present disclosure, there is provided a motherboard structure, including the above-mentioned display panel; wherein the motherboard structure has a main cut line between display panels; and an outer cut line is disposed in at least a partial area between the main cut line and the inner cut line of the display panel; an end of the outer cut line is intersected with the inner cut line; and a second crack dam is disposed between the outer cut line and the inner cut line.

According to another aspect of the present disclosure, there is provided a display device, including the above-mentioned display panel.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
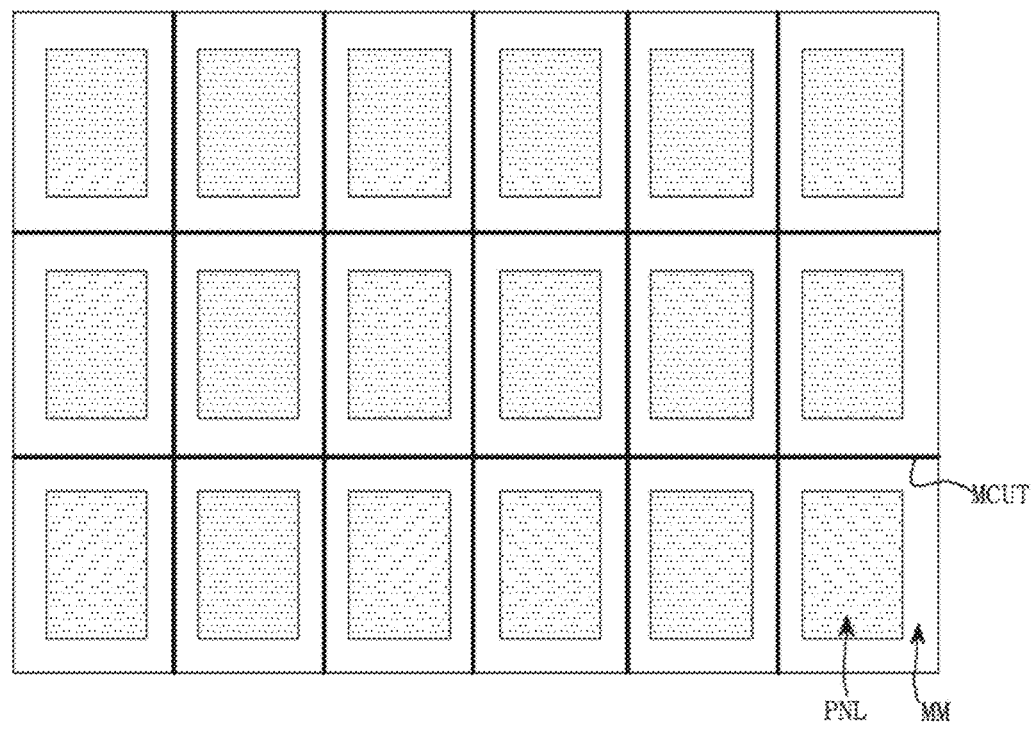
FIG. 1 is a schematic structural diagram of a motherboard structure in an embodiment of the present disclosure.

Example embodiments will now be described more fully with reference to the accompanying drawings. However, the example embodiments can be implemented in a variety of forms and should not be construed as being limited to the embodiments set forth herein; rather, these embodiments are provided so that the present disclosure will be more full and complete so as to convey the idea of the example embodiments to those skilled in this art. The same reference numerals in the drawings denote the same or similar structures, and the detailed description thereof will be omitted. In addition, the drawings are merely schematic representations of the present disclosure and are not necessarily drawn to scale.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" and "third" etc. are used only as markers, and do not limit the number of objects.

Referring to FIG. 1, the present disclosure provides a motherboard structure and a display panel PNL cut out from the motherboard structure, and the display panel PNL can be used as a display panel or as a part of a display module for display.

Figure 2:
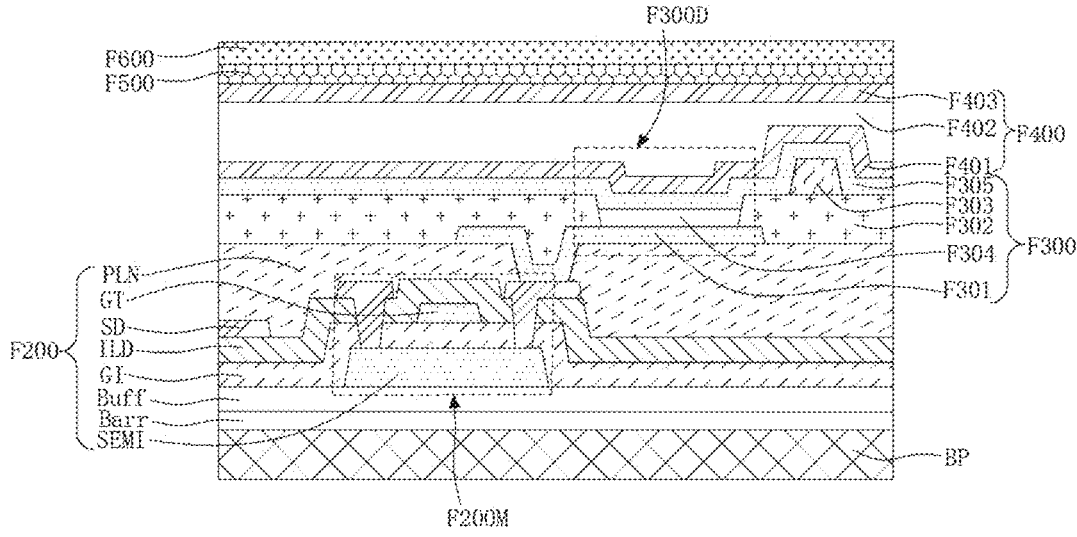
FIG. 2 is a schematic diagram of a film layer structure of a display panel in an embodiment of the present disclosure.

Referring to FIG. 2, the display panel may include an organic substrate BP, a driving circuit layer F200 and a pixel layer F300 stacked in sequence.

In some embodiments of the present disclosure, a material of the organic substrate BP can be Polyimide (PI), Polymethyl methacrylate (PMMA), Polyvinyl alcohol (PVA), Polyvinylphenol (PVP), Polyether sulfone (PES), polyimide, polyamide, polyacetal, Polycarbonate (PC), Polyethylene terephthalate (PET), Polyethylene naphthalate (PEN) or a combination thereof. In an example, the organic substrate BP may be a flexible substrate BP, and its material may be polyimide.

In other embodiments, the organic substrate BP can also be a composite of multi-layer materials. For example, the organic substrate BP may include a bottom film layer, a pressure-sensitive adhesive layer, a first polyimide layer, and a second polyimide layer that are stacked in sequence.

The driving circuit layer F200 is provided with a pixel driving circuit for driving a sub-pixel. In the driving circuit layer F200, any pixel driving circuit may include a transistor F200M and a storage capacitor. Further, the transistor F200M can be a thin film transistor, and the thin film transistor can be selected from a top-gate thin film transistor, a bottom-gate thin film transistor or a dual-gate thin film transistor. A material of an active layer of the thin film transistor can be an amorphous silicon semiconductor material, a low temperature polysilicon semiconductor material, a metal oxide semiconductor material, an organic semiconductor material or other types of semiconductor materials; and the thin film transistor can be a N-type thin film transistor or a P-type thin film transistor.

It can be understood that, among individual transistors in the pixel driving circuit, types of any two transistors may be the same or different. Exemplarily, in an embodiment, some transistors may be N-type transistors and some transistors may be P-type transistors in a pixel driving circuit. As another example, in another embodiment of the present disclosure, materials of active layers of some transistors may be low-temperature polysilicon semiconductor materials and materials of active layers of some transistors may be metal oxide semiconductor materials in a pixel driving circuit. In some embodiments of the present disclosure, the thin film transistor is a low temperature polysilicon transistor. In some other embodiments of the present disclosure, some thin film transistors are low temperature polysilicon transistors, and some thin film transistors are metal oxide transistors.

Optionally, the driving circuit layer F200 may include a semiconductor layer SEMI, a gate insulating layer GI, a gate layer GT, an interlayer dielectric layer ILD, a source-drain metal layer SD and the like stacked between the organic substrate BP and the pixel layer F300. Each thin film transistor and storage capacitor may be formed of film layers such as the semiconductor layer SEMI, the gate insulating layer GI, the gate layer GT, the interlayer dielectric layer ILD, and the source-drain metal layer SD. A positional relationship of respective film layers can be determined according to a film layer structure of the thin film transistor. Further, the semiconductor layer SEMI can be used to form a channel region of the transistor; the gate layer can be used to form gate layer traces such as a scan lead, a reset control lead, a light emission control lead, etc., and can also be used to form a gate of the transistor, and can further be used to form part or all of electrode plates of the storage capacitor; and the source-drain metal layer can be used to form source-drain metal layer traces such as a data lead, a driving power lead, etc., and can also be used to form part of the electrode plates of the storage capacitor.

For example, in some embodiments of the present disclosure, the driving circuit layer F200 may include the semiconductor layer SEMI, the gate insulating layer GI, the gate layer GT, the interlayer dielectric layer ILD and the source-drain metal layer SD sequentially stacked, and the formed thin film transistor in this way is a top-gate thin film transistor.

For another example, in some embodiments of the present disclosure, the driving circuit layer F200 may include the gate layer GT, the gate insulating layer GI, the semiconductor layer SEMI, the interlayer dielectric layer ILD and the source-drain metal layer SD stacked in sequence, and the formed thin film transistor in this way is a bottom-gate thin film transistor.

In some embodiments, the gate layer may have two or three layers. For example, in an embodiment of the present disclosure, the gate layer GT may include a first gate layer and a second gate layer, and the gate insulating layer GI may include a first gate insulating layer for isolating the semiconductor layer SEMI and the first gate layer and a second gate insulating layer for isolating the first gate layer and the second gate layer. Exemplarily, the driving circuit layer F200 may include the semiconductor layer SEMI, the first gate insulating layer, the first gate layer, the second gate insulating layer, the second gate layer, the interlayer dielectric layer ILD and the source-drain metal layer SD sequentially stacked on a side of the organic substrate BP, For another example, in an embodiment of the present disclosure, the gate layer GT may include the first gate layer and the second gate layer, and the semiconductor layer SEMI may be sandwiched between the first gate layer and the second gate layer. The gate insulating layer GI may include the first gate insulating layer for isolating the semiconductor layer SEMI and the first gate layer and the second gate insulating layer for isolating the second gate layer and the semiconductor layer SEMI. Exemplarily, in an embodiment of the present disclosure, the driving circuit layer F200 may include the first gate layer, the first gate insulating layer, the semiconductor layer SEMI, the second gate insulating layers, the second gate layer, the interlayer dielectric layer ILD and the source-drain metal layer SD sequentially stacked on the side of the organic substrate BP. In this way, a transistor with a dual-gate structure can be formed. For another example, in an embodiment of the present disclosure, the semiconductor layer SEMI may include a low-temperature polysilicon semiconductor layer and a metal oxide semiconductor layer; the gate layer includes a first gate layer and a second gate layer, and the gate insulation layer include the first gate insulating layer and the second gate insulating layer. The driving circuit layer F200 may include the low-temperature polysilicon semiconductor layer, the first gate insulating layer, the first gate layer, the metal oxide semiconductor layer, the second gate insulating layer, the second gate layer, the interlayer dielectric layer ILD and the source-drain metal layer SD sequentially stacked on the side of the organic substrate BP. For another example, in an embodiment of the present disclosure, the semiconductor layer SEMI may include the low-temperature polysilicon semiconductor layer and the metal oxide semiconductor layer, the gate layer includes first to third gate layers, and the gate insulating layer includes first to third gate insulating layer. The driving circuit layer F200 may include the low-temperature polysilicon semiconductor layer, the first gate insulating layer, the first gate layer, an insulating buffer layer, the second gate layer, the second gate insulating layer, the metal oxide semiconductor layer, the third gate insulating layer, the third gate layer, the interlayer dielectric layer ILD and the source-drain metal layer SD sequentially stacked on the side of the organic substrate BP.

In some embodiments, the source-drain metal layer may have two or three layers. For example, in an embodiment of the present disclosure, the source-drain metal layer may include a first source-drain metal layer and a second source-drain metal layer sequentially stacked on a side of the interlayer dielectric layer ILD away from the substrate. An insulating layer may be sandwiched between the first source-drain metal layer and the second source-drain metal layer, and for example, a passivation layer and/or a planarization layer may be sandwiched between the first source-drain metal layer and the second source-drain metal layer. For another example, in an embodiment of the present disclosure, the source-drain metal layer may include the first source-drain metal layer, the second source-drain metal layer and a third source-drain metal layer sequentially stacked on the side of the interlayer dielectric layer ILD away from the substrate. An insulating layer may be sandwiched between the first source-drain metal layer and the second source-drain metal layer, and for example, a passivation layer and/or a resin layer may be sandwiched between the first source-drain metal layer and the second source-drain metal layer. An insulating layer may be sandwiched between the second source-drain metal layer and the third source-drain metal layer, and for example, a passivation layer and/or a planarization layer may be sandwiched between the second source-drain metal layer and the third source-drain metal layer.

Optionally, the driving circuit layer F200 may further include a passivation layer, and the passivation layer may be disposed on a surface of the source-drain metal layer SD away from the organic substrate BP, so as to protect the source-drain metal layer SD.

Optionally, the driving circuit layer F200 may further include an inorganic buffer layer Buff disposed between the organic substrate BP and the semiconductor layer SEMI, and the semiconductor layer SEMI, the gate layer GT, etc. are located on a side of the inorganic buffer layer Buff away from the organic substrate BP. A material of the inorganic buffer layer Buff can be an inorganic insulating material such as silicon oxide and silicon nitride. The buffer material layer can be a layer of inorganic material, or a multi-layer laminated inorganic material.

Optionally, the driving circuit layer F200 can further include an inorganic blocking layer Barr disposed between the organic substrate BP and the inorganic buffer layer Buff, and the blocking layer can shield the organic substrate BP, avoiding a component in the organic substrate BP penetrating into the semiconductor layer SEMI to affect the stability of the pixel driving circuit.

Optionally, the driving circuit layer F200 may further include a planarization layer PLN located between the source-drain metal layer SD and the pixel layer F300, and the planarization layer PLN may provide a planarized surface for a pixel electrode. Optionally, a material of the planarization layer PLN may be an organic material.

Figure 10:
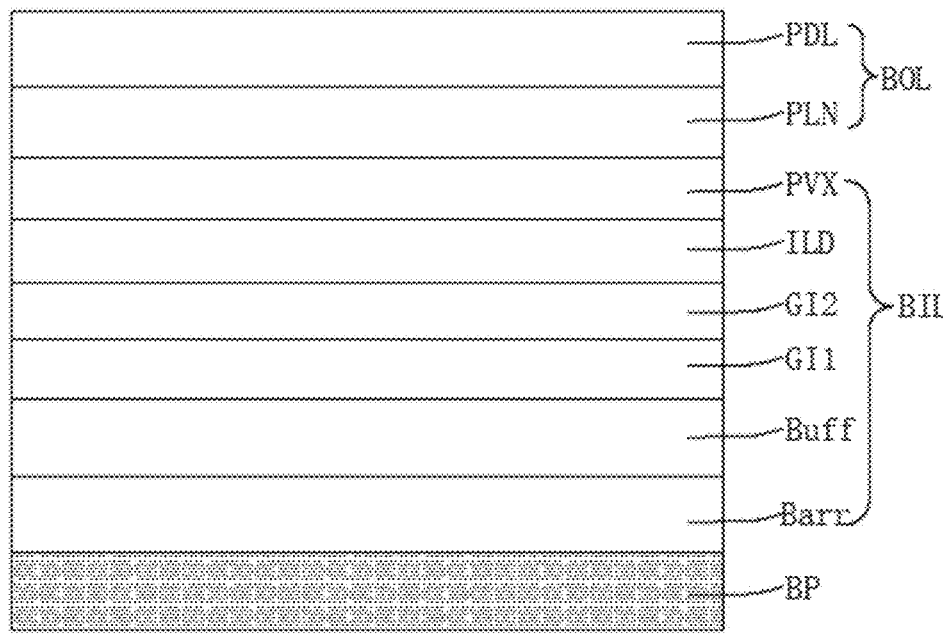
FIG. 10 is a schematic diagram of a film layer structure of a display panel near an edge in an embodiment of the present disclosure.

Referring to FIG. 10, near an edge of the display panel PNL, individual layers of inorganic materials can form an inorganic material layer BIL of the display panel PNL. In an example, near an edge of the display panel PNL, the inorganic material layer BIL of the display panel PNL may include the inorganic blocking layer Barr, the inorganic buffer layer Buff, the gate insulating layer GI, the interlayer dielectric layer ILD, etc. sequentially stacked on the organic substrate BP. In some other examples, the inorganic material layer BIL may further include a passivation layer PVX. It can be understood that, in the display panel PNL shown in FIG. 10, the gate insulating layer GI includes two layers such as the first gate insulating layer GI1 and the second gate insulating layer GI2. In other embodiments of the present disclosure, the gate insulating layer GI may have one layer, or three or more layers.

In an example, a thickness of the inorganic blocking layer Barr may be in a range of 450-650 nanometers, such as 550 nanometers.

In an example, a thickness of the inorganic buffer layer Buff may be in a range of 300-500 nanometers, such as 400 nanometers.

In an example, a thickness of the first gate insulating layer GI1 may be in a range of 100-150 nanometers, such as 120 nanometers.

In an example, a thickness of the second gate insulating layer GI2 may be in a range of 100-150 nanometers, such as 130 nanometers.

In an example, a thickness of the interlayer dielectric layer ILD may be in a range of 400-600 nanometers, such as 500 nanometers.

In an example, a thickness of the passivation layer PVX may be in a range of 100-200 nanometers, such as 150 nanometers.

The pixel layer F300 may be provided with sub-pixels. In some embodiments, for example, in a liquid crystal display panel, a pixel electrode, a common electrode and a liquid crystal layer can form an optical switch for controlling a polarization direction of light, and the optical switch can be used as a sub-pixel in the present disclosure. In some other embodiments, the pixel layer may be provided with a light emitting element that is electrically coupled to the pixel driving circuit correspondingly, and the light emitting element can be used as a sub-pixel of the display panel.

Exemplarily, the pixel layer is provided with light emitting elements distributed in an array, and each light emitting element emits light under the control of the pixel driving circuit. In the present disclosure, the light emitting element may be an Organic Light Emitting Diode (OLED), a Micro Light Emitting Diode (Micro LED), a Quantum Dot-Organic Light Emitting Diode (QD-OLED), a Quantum Dot Light Emitting Diode (QLED) or other types of light emitting elements. Exemplarily, in an embodiment of the present disclosure, the light emitting element is an Organic Light Emitting Diode (OLED), and the display panel is an OLED display panel. In the following, taking the light emitting element as the organic light emitting diode as an example, a possible structure of the pixel layer is exemplarily introduced.

Optionally, the pixel layer F300 may be disposed on a side of the driving circuit layer F200 away from the organic substrate BP, and may include a pixel electrode layer F301, a pixel definition layer F302, a support column layer F303, an organic light emitting functional layer F304 and a common electrode layer F305 stacked in sequence. The pixel electrode layer F301 has a plurality of pixel electrodes in a display area of the display panel. The pixel definition layer F302 has a plurality of through pixel openings in the display area disposed in one-to-one correspondence with the plurality of pixel electrodes, and any pixel opening exposes at least a partial area of the corresponding pixel electrode. The support column layer F303 includes a plurality of support columns in the display area, and the support columns are located on a surface of the pixel definition layer F302 away from the organic substrate BP, so as to support a Fine Metal Mask (FMM) during an evaporation process. The organic light emitting functional layer F304 at least covers the pixel electrode exposed by the pixel definition layer F302. The organic light emitting functional layer F304 may include an organic electroluminescent material layer, and may include one or more of a hole injection layer, a hole transport layer, an electron blocking layer, a hole blocking layer, an electron transport layer, and an electron injection layer. Each film layer of the organic light emitting functional layer F304 can be manufactured by an evaporation process, and the fine metal mask or an Open Mask can be used to define a pattern of each film layer during the evaporation. The common electrode layer F305 can cover the organic light emitting functional layer F304 in the display area. In this way, the pixel electrode, the common electrode layer F305 and the organic light emitting functional layer F304 between the pixel electrode and the common electrode layer F305 form an organic light emitting diode F300D, and any organic light emitting diode can be used as a sub-pixel of the display panel.

In some embodiments, the pixel layer F300 may further include a light extraction layer located on a side of the common electrode layer F305 away from the organic substrate BP, so as to enhance a light extraction efficiency of the organic light emitting diode.

In an example, the organic material layer BOL may include film layers such as a planarization layer and a pixel definition layer. It can be understood that in the motherboard structure and the display panel PNL of the present disclosure, the inorganic material layer BIL can be a combination of other different inorganic layers, and the organic material layer BOL can be a combination of other organic layers, depending on a type and processes of the display panel PNL.

Optionally, the display panel may further include a thin film encapsulation layer F400. The thin film encapsulation layer F400 is disposed on a surface of the pixel layer F300 away from the organic substrate BP, and may include inorganic encapsulation layers and organic encapsulation layers alternately stacked. The inorganic encapsulation layer can effectively block moisture and oxygen from the outside, preventing water and oxygen from invading the organic light emitting functional layer F304 to cause material degradation. Optionally, an edge of the inorganic encapsulation layer may be located in the peripheral area. The organic encapsulation layer is located between two adjacent inorganic encapsulation layers, so as to realize planarization and weaken the stress between the inorganic encapsulation layers. An edge of the organic encapsulation layer may be located between an edge of the display area and an edge of the inorganic encapsulation layer. Exemplarily, the thin film encapsulation layer F400 includes a first inorganic encapsulation layer F401, an organic encapsulation layer F402 and a second inorganic encapsulation layer F403 sequentially stacked on a side of the pixel layer F300 away from the organic substrate BP.

Optionally, the display panel may further include a touch function layer F500, disposed on a side of the thin film encapsulation layer F400 away from the organic substrate BP and used to realize a touch operation of the display panel.

Optionally, the display panel may also include an anti-reflection layer F600, which may be disposed on a side of the thin-film encapsulation layer F400 away from the pixel layer F300 and used to reduce the reflection of the display panel to ambient light, thereby reducing an impact of the ambient light on the display. In an embodiment of the present disclosure, the anti-reflection layer F600 may include a color filter layer and a black matrix layer that are stacked, so as to reduce the interference of the ambient light while avoiding reducing the light transmittance of the display panel. In another embodiment of the present disclosure, the anti-reflection layer F600 may be a polarizer, such as a patterned coated circular polarizer. Further, the anti-reflection layer F600 may be disposed on a side of the touch function layer F500 away from the organic substrate BP.

FIG. 1 shows a schematic plan view of a motherboard structure. Referring to FIG. 1, the motherboard structure has a plurality of display panels PNL, for example, display panels PNL distributed in an array. A main cut line MCUT is disposed between the display panels PNL on the motherboard structure. When the display panel PNL is manufactured by cutting, the motherboard structure can be cut into a plurality of daughterboard structures MM by firstly cutting along the main cut line MCUT, and each daughterboard structure MM includes one display panel PNL. In this way, the main cut line MCUT defines an edge of the daughterboard structure MM. Then, the daughterboard structure MM is further cut to obtain the required display panel PNL.

Figure 3:
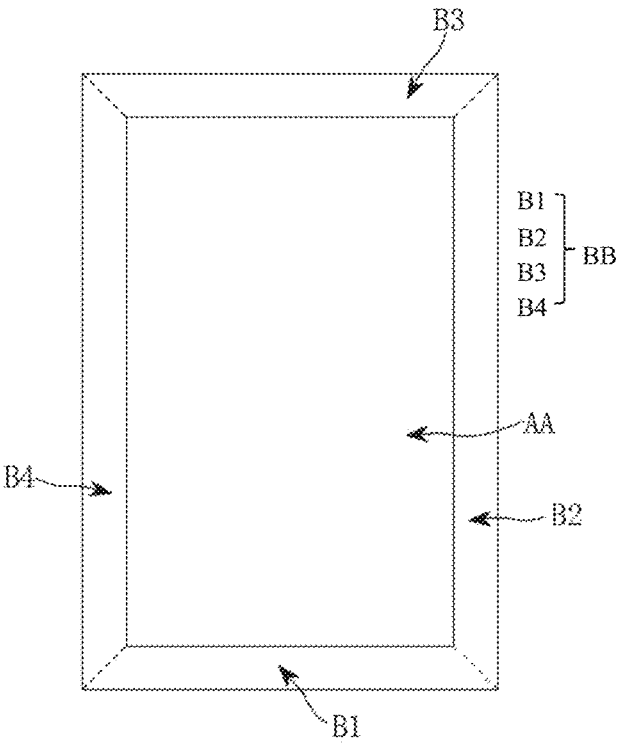
FIG. 3 is a schematic structural diagram of a display panel in an embodiment of the present disclosure.
Figure 4:
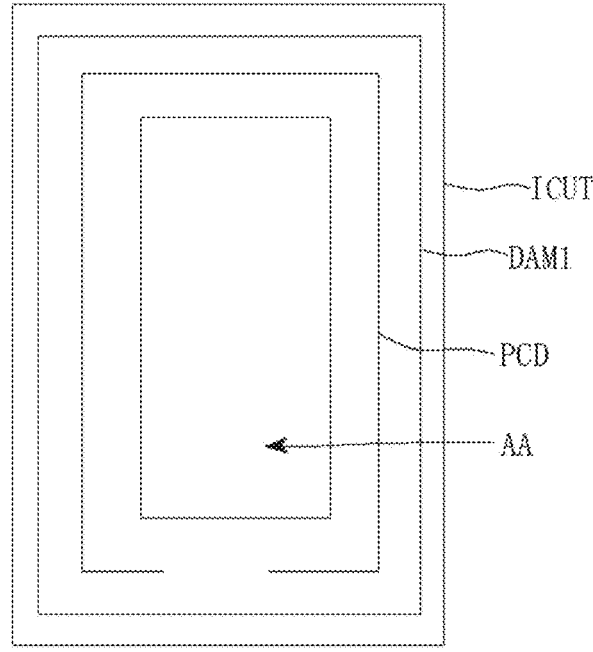
FIG. 4 is a schematic structural diagram of a part of a display panel within an inner cut line in an embodiment of the present disclosure.
Figure 5:
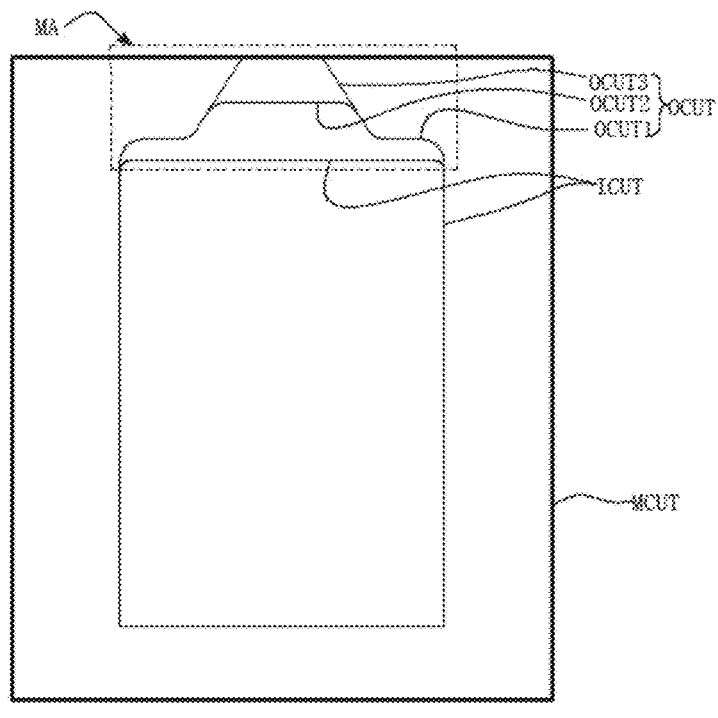
FIG. 5 is a schematic structural diagram of a daughter-board structure in an embodiment of the present disclosure.
Figure 6:
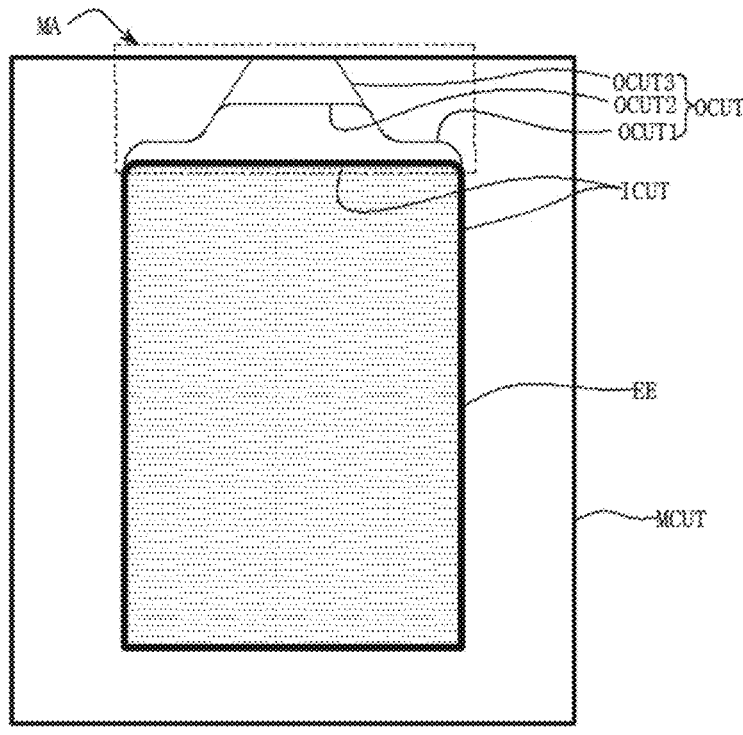
FIG. 6 is a schematic structural diagram of a cutting track of a daughterboard structure in an embodiment of the present disclosure.
Figure 7:
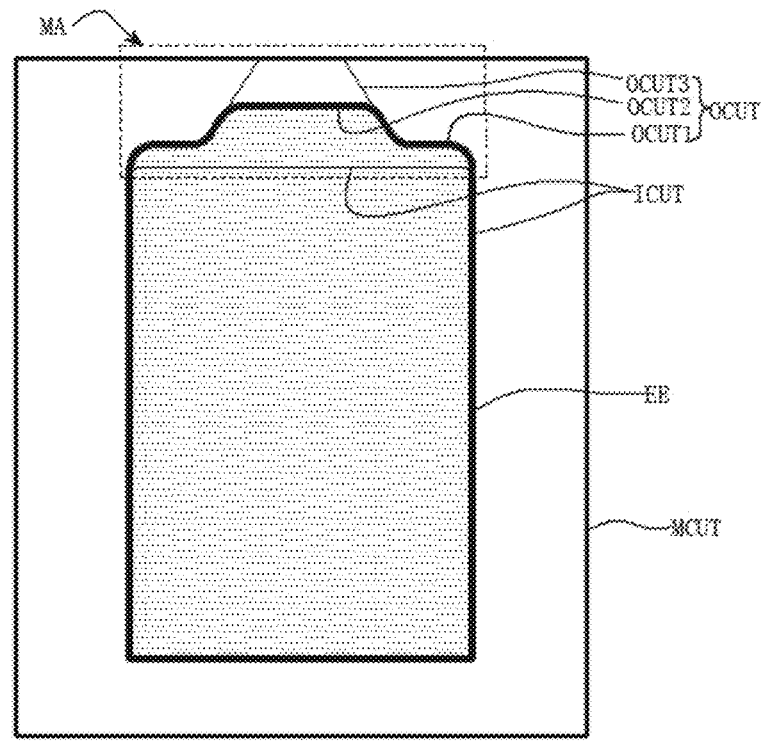
FIG. 7 is a schematic structural diagram of a cutting track of a daughterboard structure in an embodiment of the present disclosure.
Figure 8:
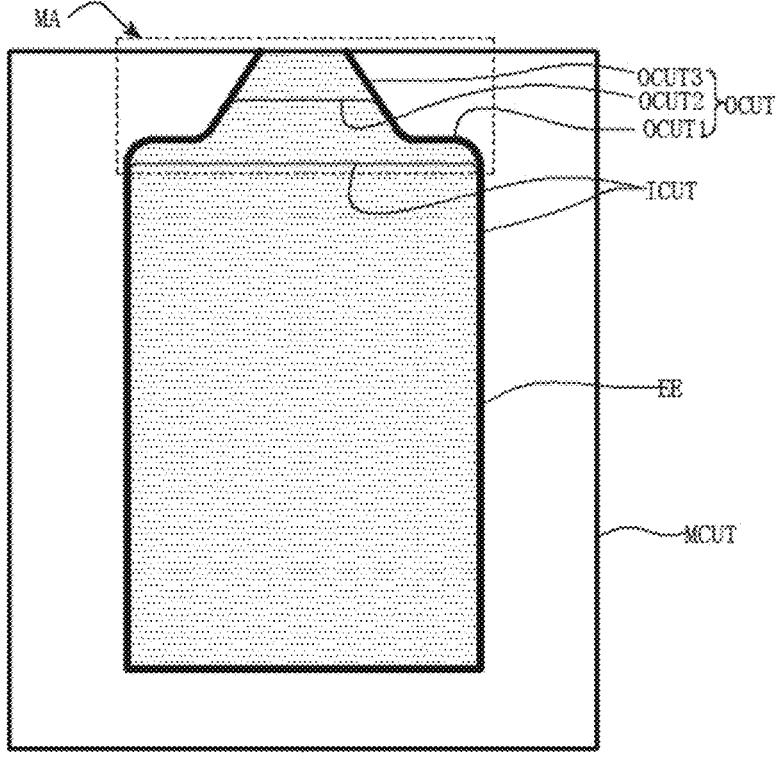
FIG. 8 is a schematic structural diagram of a cutting track of a daughterboard structure in an embodiment of the present disclosure.

FIG. 3 shows a schematic diagram of a planar structure of a display panel PNL, FIG. 4 shows a schematic diagram of a planar structure of a display panel PNL within an inner cut line ICUT. FIG. 5 shows a schematic diagram of a planar structure of a daughterboard structure MM, and FIGS. 6 to 8 show a schematic structural diagram of a display panel PNL that can be obtained based on a daughterboard structure MM in FIG. 5. Referring to FIG. 3, the display panel PNL includes a display area AA and a peripheral area BB surrounding the display area AA. Referring to FIGS. 4 to 8, the display panel PNL has the inner cut line ICUT surrounding the display area AA at an edge EE of the display panel PNL or an area adjacent to the edge EE. Referring to FIG. 5, an area between the inner cut line ICUT and the main cut line MCUT (including the inner cut line ICUT) in the daughterboard structure MM is at least partially a compatible cutting area MA, and an outer cut line OCUT is disposed in the compatible cutting area MA. In other words, at least a partial area between the inner cut line ICUT and the main cut line MCUT is provided with the outer cut line OCUT, and these areas provided with the outer cut line OCUT are the compatible cutting area MA. Unless otherwise specified, the inorganic materials in the inner cut line ICUT and the outer cut line OCUT are removed or thinned to reduce the risk of generating cracks during cutting and reduce a crack size, and improving a yield and the reliability of the display panel.

Referring to FIG. 5 (only one compatible cutting area MA is schematically shown), in any compatible cutting area MA, an end of the outer cut line OCUT is intersected with the inner cut line ICUT, and the other end is intersected with the inner cut line ICUT or the main cut line MCUT. In this way, when the daughterboard structure MM is cut to obtain the display panel PNL, it can be cut along the inner cut line ICUT outside the compatible cutting area MA; that is, outside the compatible cutting area MA, a cutting track is within the inner cut line ICUT. In the compatible cutting area MA, the cutting can be performed along the inner cut line ICUT or the outer cut line OCUT; that is, in the compatible cutting area MA, the cutting track can be within the inner cut line ICUT or the outer cut line OCUT. The cut line selected when the daughterboard structure MM is cut finally defines the edge EE of the display panel PNL. An area to be cut is between the edge EE of the display panel PNL and the main cut line MCUT. In the present disclosure, since the motherboard structure is provided with the outer cut line OCUT in the compatible cutting area MA, it is possible to select different cut lines and combine different cutting tracks to obtain different display panels PNL, thereby achieving the purpose of manufacturing different display panels PNL with the same motherboard structure, improving the versatility of the motherboard structure, reducing the cost of the display panel PNL and meeting personalized demands of different display products for the display panel PNL. In an embodiment of the present disclosure, a starting node and an end node of the compatible cutting area MA may be defined according to an intersection node of the outer cut line OCUT and the inner cut line ICUT.

FIG. 5 shows an example in which the daughterboard structure MM has one compatible cutting area MA, and there are three outer cut lines OCUT of a first outer cut line OCUT1, a second outer cut line OCUT2 and a third outer cut line OCUT3 in the compatible cutting area MA. It can be understood that in other embodiments of the present disclosure, the daughterboard structure MM may have a plurality of compatible cutting areas MA, and there may be more or less outer cut lines OCUT in the compatible cutting areas MA. Taking the daughterboard structure MM shown in FIG. 5 as an example, the number of first outer cut lines OCUT1 is two, and an end of the first outer cut line OCUT1 close to the inner cut line ICUT is intersected with the inner cut line ICUT; the second outer cut line OCUT2 is located between the two first outer cut lines OCUT1, and two ends are respectively intersected with ends of the two first outer cut lines OCUT1 away from the inner cut line ICUT; the number of third outer cut lines OCUT3 is two and the third outer cut lines OCUT3 has a one-to-one correspondence with the two first outer cut lines OCUT1, one end of the third outer cut line OCUT3 is intersected with the main cut line MCUT, and the other end is intersected with an end of the corresponding first outer cut line OCUT1 away from the display area AA.

When the daughterboard structure MM is cut, the cutting track outside the compatible cutting area MA can be set along the inner cut line ICUT. In the compatible cutting area MA of the above example, there are three different cutting tracks available for selection as follows, that is, the inner cut line ICUT is selected as the cutting track, the first outer cut line OCUT1-to-the second outer cut line OCUT2-to-the first outer cut line OCUT1 is selected as the cutting track, and the first outer cut line OCUT1-to-the third outer cut line OCUT3-to-the third outer cut line OCUT3-to-the first outer cut line OCUT1 is selected as the cutting track. Referring to FIG. 6, in an example, the inner cut line ICUT is selected as the cutting track in the compatible cutting area MA; the cutting track is indicated by a thick line EE in FIG. 6, and the thick line EE also indicates an edge of the cut display panel PNL; and an overall shape and range of the display panel PNL are indicated by dot matrix filling. Referring to FIG. 7, in another example, the first outer cut line OCUT1-to-the second outer cut line OCUT2-to-the first outer cut line OCUT1 is selected as the cutting track in the compatible cutting area MA; the cutting track is indicated by a thick line EE in FIG. 7, and the thick line EE also indicates an edge of the cut display panel PNL; and an overall shape and range of the display panel PNL are indicated by dot matrix filling. Referring to FIG. 8, in another example, the first outer cut line OCUT1-to-the third outer cut line OCUT3-to-the third outer cut line OCUT3-to-the first outer cut line OCUT1 is selected as the cutting track in the compatible cutting area MA; the cutting track is indicated by a thick line EE in FIG. 8, and the thick line EE also indicates at least part of an edge of the cut display panel PNL; and an overall shape and range of the display panel PNL are indicated by dot matrix filling. It can be seen that different cutting tracks are formed by selecting different cut lines in the compatible cutting area MA, and then different display panels PNL can be cut. An actual cutting track defines the edge of the display panel PNL.

In an embodiment of the present disclosure, when all the inner cut lines ICUT are selected as the cutting track, the obtained display panel PNL may not have the compatible cutting area MA, that is, parts outside individual inner cut lines ICUT (including each outer cut line OCUT) can be cut out. In this way, the motherboard structure of the present disclosure may have display panels PNL distributed in an array, and the edges of the display panels PNL are defined by the inner cut lines ICUT. The outer cut lines OCUT may be disposed outside the display panel PNL to improve the versatility of the motherboard structure, but these outer cut lines OCUT and the like are cut out when the cutting is performed to form the display panel PNL.

In another embodiment of the present disclosure, when the outer cut line OCUT is selected as the cutting track in a certain compatible cutting area MA, at least part of the compatible cutting area MA is retained in the display panel PNL.

FIG. 10 shows a schematic diagram of a film layer structure of a display panel PNL in an area near an edge. Referring to FIG. 10, in the area near the edge, the display panel PNL includes an organic substrate BP, an inorganic material layer BIL and an organic material layer BOL that are sequentially stacked. In the inner cut line ICUT, the inorganic material layer BIL may be thinned or removed to form an annular cutting groove, and the cutting groove is filled with the organic material layer BOL. In this way, the inner cut line ICUT has less or no inorganic material, which can reduce the generation of crack both during cutting and after cutting. In an example, the inorganic material in the inner cut line ICUT may be completely removed.

In some embodiments of the present disclosure, referring to FIG. 3 and FIG. 4, in the peripheral area BB, a first crack dam DAM1 is disposed inside of the inner cut line ICUT (that is, a side of the inner cut line ICUT close to the display area AA). In this way, when the cutting is performed along the inner cut line ICUT, the first crack dam DAM1 can prevent the crack generated during the cutting from spreading from the edge of the display panel PNL to the display area AA, thereby achieving the purpose of protecting the display panel PNL.

Figure 9:
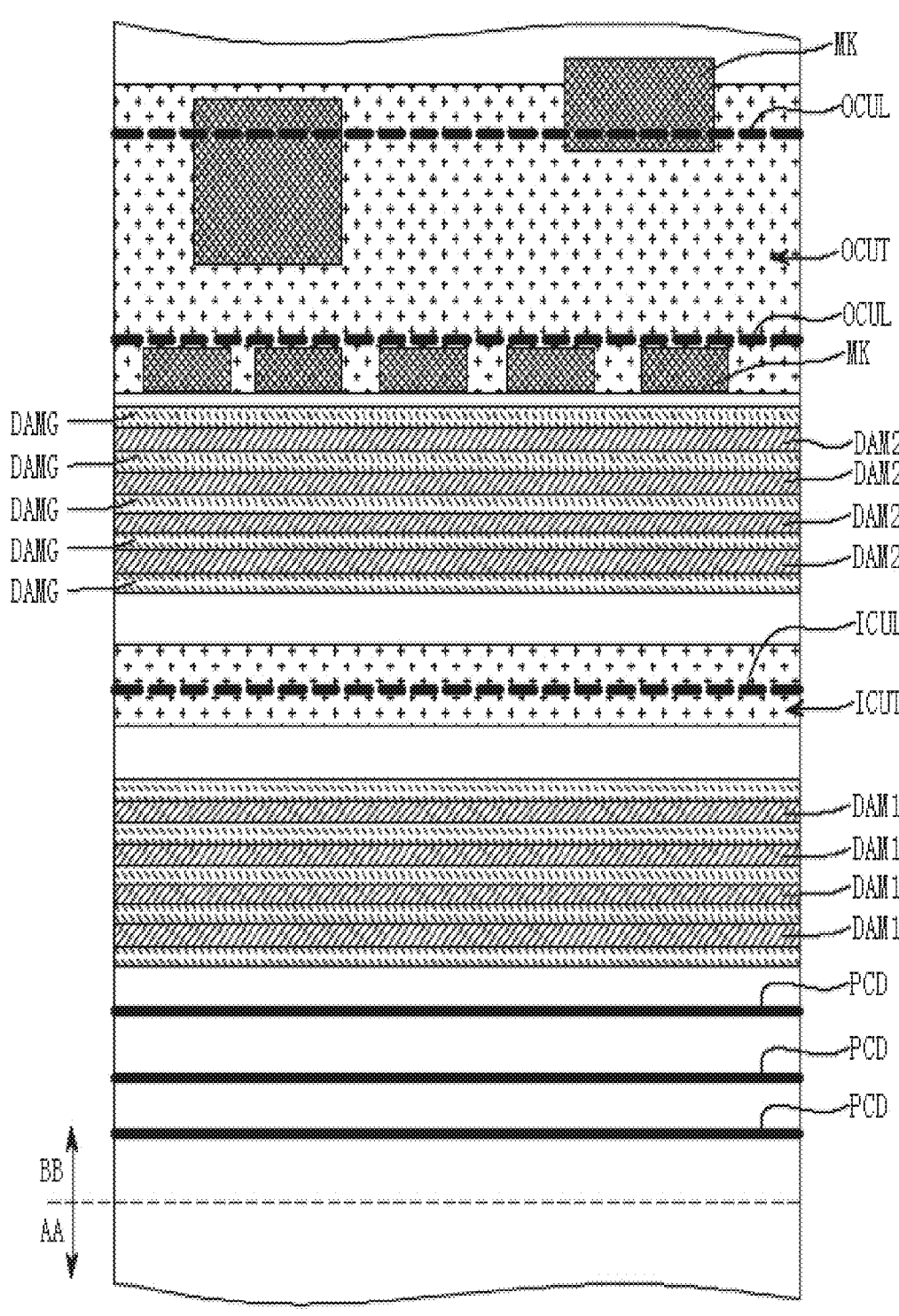
FIG. 9 is a schematic diagram of a partial structure of a daughterboard structure in a compatible cutting area in an embodiment of the present disclosure.

Optionally, referring to FIG. 9, there are a plurality of first crack dams DAM1 formed of the inorganic material layer BIL, and a groove is disposed between two adjacent first crack dams DAM1, and the groove is filled with the organic material layer BOL. In other words, in an area where the first crack dam DAM1 is located, the inorganic material layer BIL can be thinned or removed to form the groove, and the remaining part of the inorganic material layer BIL can be used as the first crack dam DAM1 When the crack extends towards the display area AA, it can be blocked by the first crack dam DAM1. Note that, depending on the manufacturing process, the groove between the first crack dams DAM1 may further be covered with the inorganic material, such as a passivation layer, provided that the inorganic material does not completely fill the groove.

Referring to FIG. 4, in an embodiment of the present disclosure, the display panel PNL is further provided with a crack detection trace PCD for detecting the crack at the edge of the display panel PNL between the display area AA and the first crack dam DAM1. If the crack passes through the first crack dam DAM1 and extends to the vicinity of the crack detection trace PCD, it may cause the crack detection trace PCD to be disconnected or a change of the characteristics such as the resistance. In this way, the crack at the edge of the display panel PNL can be monitored by monitoring the state of the crack detection trace PCD. Optionally, there are a plurality of crack detection traces PCD, so as to improve the sensitivity and accuracy of crack detection.

Referring to FIG. 3, in some embodiments of the present disclosure, the peripheral area BB includes a first peripheral area B1, a second peripheral area B2, a third peripheral area B3 and a fourth peripheral area B4 surrounding the display area AA and connected end to end in sequence. The first peripheral area B1 and the third peripheral area B3 are disposed opposite to each other; and the first peripheral area B1 has a bonding pad for bonding an external circuit. The outer cut line OCUT is disposed in the first peripheral area B1 and/or the third peripheral area B3. In the present disclosure, an end close to the first peripheral area B1 can be defined as a proximal end of the display panel PNL or the daughterboard structure MM, and an end close to the third peripheral area B3 can be defined as a distal end of the display panel PNL or the daughterboard structure MM. In this embodiment, the outer cut line OCUT can be disposed at a proximal or distal area of the daughterboard structure MM, or can be disposed both at the proximal area and the distal area of the daughterboard structure MM.

As an example, a part or the whole of the first peripheral area B1 is a part of the compatible cutting area MA, and the outer cut line OCUT is disposed in the compatible cutting area MA. As another example, a part or the whole of the third peripheral area B3 is a part of the compatible cutting area MA, and the outer cut line OCUT is disposed in the compatible cutting area MA. As still another example, a part or the whole of the first peripheral area B1 is a part of the compatible cutting area MA, and the outer cut line OCUT is disposed in the compatible cutting area MA; and a part or the whole of the third peripheral area B3 is a part of the compatible cutting area MA, and the outer cut line OCUT is disposed in the compatible cutting area MA.

Optionally, the compatible cutting area MA may not be limited to the first peripheral area B1 and the third peripheral area B3, but may also extend to the second peripheral area B2 or the fourth peripheral area B4.

For example, referring to FIG. 5, the display panel PNL has at least one rounded corner, and the outer cut line OCUT is at least partially disposed at the rounded corner. In other words, an area where the at least one rounded corner is located may be a part of the compatible cutting area MA. In this way, for the display panel PNL, different cutting tracks can be selected at the rounded corner, thereby having different rounded corners. When the outer cut line OCUT is selected as the cutting track at the rounded corner in the display panel PNL, an edge of the at least one rounded corner of the display panel PNL partially overlaps with the outer cut line OCUT.

Referring to FIG. 9, on the daughterboard structure MM, an identification mark MK is disposed between the inner cut line ICUT and the main cut line MCUT (not shown in FIG. 9), so as to perform alignment and effect evaluation during the manufacturing of the display panel PNL, for example, the identification mark MK is used by an exposure machine to perform alignment and detect the exposure effect. In order to ensure that the identification mark MK can be accurately identified, the inorganic material layer BIL in an area where the identification mark MK is located needs to be retained. However, there is often a conflict between the area where the identification mark MK is located and the area where the outer cut line OCUT is located, and this conflict is particularly prominent in a display panel PNL with a narrow border, which reduces the ability of the outer cut line OCUT to suppress the crack.

Referring to FIG. 9, the inorganic material layer BIL is generally thinned or removed in the outer cut line OCUT to reduce the inorganic material in the cut line. Upon cutting, it is generally necessary to cut along a preset cutting track line OCUL, so that the film layers on both sides of the cutting track line OCUL have been reduced or removed of the inorganic material. Correspondingly, the inorganic material layer BIL is generally thinned or removed in the inner cut line ICUT to reduce the inorganic material in the cut line. Upon cutting, it is generally necessary to cut along a preset cutting track line ICUL, so that the film layers on both sides of the cutting track line ICUL have been reduced or removed of the inorganic material.

In some cases, referring to FIG. 9, there is an overlapping part between an area where some identification marks MK are located and the outer cut line OCUT, and in particular, the area where some identification marks MK are located may overlap with the cutting track line OCUL in the outer cut line OCUT. In this case, the outer cut line OCUT can be disconnected (that is, the inorganic material layer BIL is not thinned or removed) to avoid the identification mark MK, thereby ensuring the clarity and accuracy of the identification mark MK. In this way, for a portion passed by the cutting track line OCUL, the inorganic material layer BIL is not necessarily thinned or removed. In the portion where the cutting track line OCUL overlaps with the identification mark MK, the crack tends to occur upon the cutting.

In some other cases, referring to FIG. 9, there is a certain overlap between the area where some identification marks MK are located and the area where the outer cut line OCUT is located. In this case, a width of the outer cut line OCUT can be narrowed to avoid the identification mark MK, thereby ensuring the clarity and accuracy of the identification mark MK. In other words, the outer cut line OCUT is adjacent to some identification marks MK, and a width of a part of the outer cut line OCUT close to the identification mark MK is smaller than a width of a remaining part of the outer cut line OCUT. However, the width of the outer cut line OCUT is narrowed, making it prone to the crack upon cutting. In particular, if the identification mark MK that causes to narrow the outer cut line OCUT is disposed between the inner cut line ICUT and the outer cut line OCUT, it is more unfavorable to block the extension of the crack.

In the motherboard structure of the present disclosure, referring to FIG. 9, a second crack dam DAM2 may be disposed between the outer cut line OCUT and the inner cut line ICUT to prevent a crack generated during the cutting of the outer cut line OCUT from extending to the display area AA, and compensate the ability of the outer cut line OCUT to suppress the crack.

In an embodiment of the present disclosure, referring to FIG. 9, the second crack dam DAM2 may be disposed between the identification mark MK and the inner cut line ICUT. In this way, the crack generated during the cutting of the outer cut line OCUT needs to break through the second crack dam DAM2 before it can extend to the inner cut line ICUT, and then be further blocked by the inner cut line ICUT and the first crack dam DAM1. In this way, the motherboard structure of the present disclosure can compensate for the crack suppression ability of the outer cut line OCUT, reducing the risk of the crack generated by the outer cut line OCUT extending into the first crack dam DAM1, so that the motherboard structure can be flexibly used to manufacture different display panels PNL and the motherboard structure can avoid the yield rate of the display panel PNL decreasing.

In an embodiment of the present disclosure, the second crack dam DAM2 can be disposed only between each identification mark MK and the inner cut line ICUT, so that each outer cut line OCUT and each identification mark MK are located at a side of the second crack dam DAM2 away from the inner cut line ICUT. In this way, the second crack dam DAM2 is disposed between the outer cut line OCUT closest to the display area AA and the inner cut line ICUT. Note that, in other embodiments of the present disclosure, the second crack dam DAM2 may also be disposed between two adjacent outer cut lines OCUT to achieve a better effect.

In some embodiments of the present disclosure, referring to FIG. 9, there may be a plurality of second crack dams DAM2. A crack blocking groove DAMG is disposed between two adjacent second crack dams DAM2, and the crack blocking groove DAMG is filled with the organic material. In this way, the inorganic material between the second crack dams DAM2 is thinned or removed, and two adjacent second crack dams DAM2 are spaced apart by the organic material, and when the crack extends to the crack blocking groove DAMG, the organic material can effectively absorb and disperse the stress at the tip of the crack, thereby preventing the crack from continuing to extend. Optionally, a material of the second crack dam DAM2 may be the inorganic material. The crack blocking groove DAMG between the second crack dams DAM2 can be completely filled with the organic material, or can be partially covered by a new inorganic material and filled with the organic material. Further, the crack blocking groove DAMG can also be disposed on the inside (a side close to the display area AA) of the innermost second crack dam DAM2 and the outside (a side away from the display area AA) of the outermost second crack dam DAM2, so that any second crack dam DAM2 is sandwiched between two adjacent crack blocking grooves DAMG.

In this embodiment, the second crack dam DAM2 can be manufactured by patterning the inorganic material layer BIL, for example, a layout area of the inorganic material layer BIL can be thinned or removed to form the crack blocking groove DAMG, and the remaining inorganic material layer BIL in the area where the retaining wall DAM2 is located forms the required second crack dam DAM2. It can be understood that after the second crack dam DAM2 is formed, the second crack dam DAM2 and the crack blocking groove DAMG may also be covered with other inorganic layers, provided that there is a crack blocking groove DAMG between the second crack dams DAM2.

In an embodiment of the present disclosure, in the area where the second crack dam DAM2 is located, the number of the second crack dams DAM2 is in a range of 2-8. Depths of any two crack blocking grooves DAMG can be the same or different; and the two crack blocking grooves DAMG can be manufactured in the same patterning process or in different patterning processes.

Figure 11:
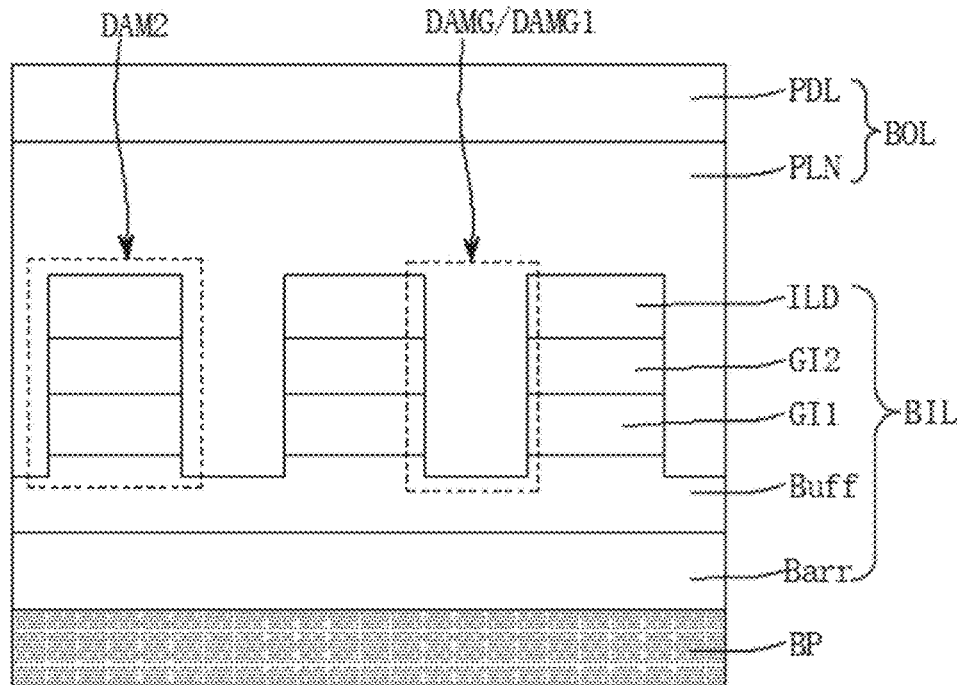
FIG. 11 is a schematic structural diagram of a first crack blocking groove filled with an organic material layer in an embodiment of the present disclosure.
Figure 12:
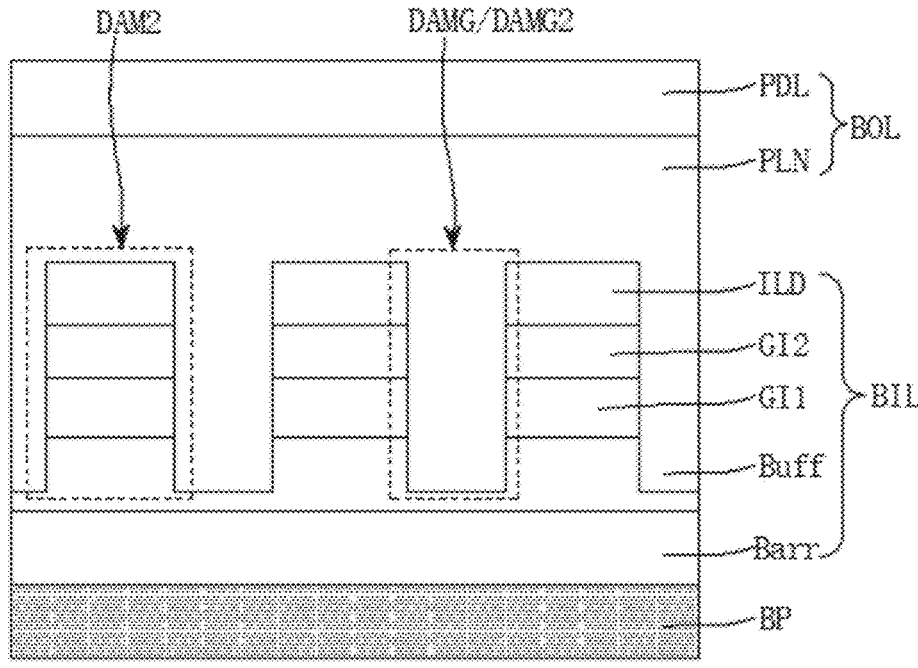
FIG. 12 is a schematic structural diagram of a second crack blocking groove filled with an organic material layer in an embodiment of the present disclosure.

In an embodiment of the present disclosure, referring to FIG. 11 and FIG. 12, a bottom of at least one crack blocking groove DAMG is located at the inorganic material layer BIL, and for example, the bottom of the at least one crack blocking groove DAMG is located at the inorganic buffer layer Buff or the inorganic blocking layer Barr.

Figure 13:
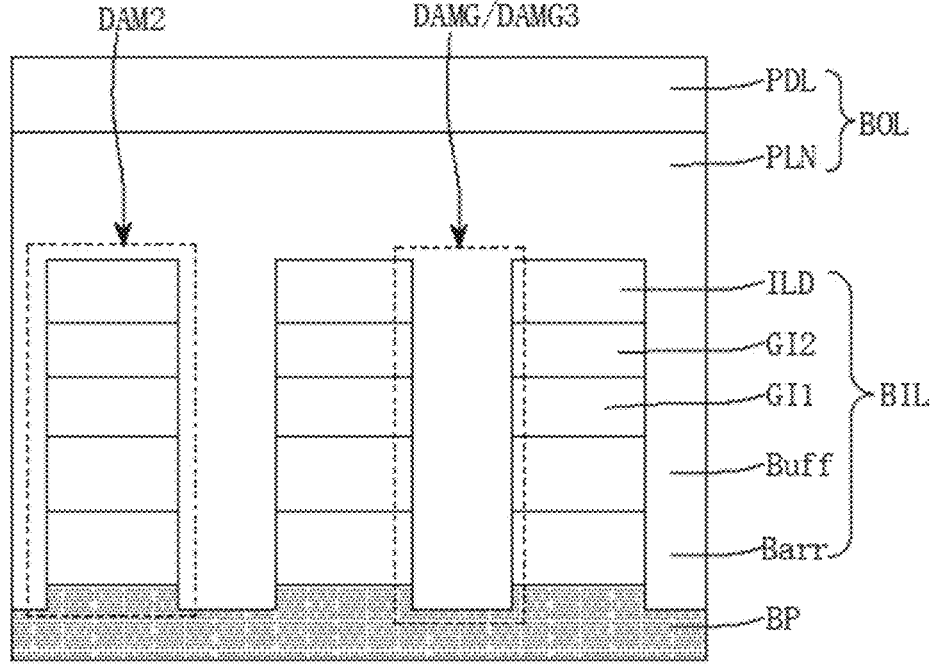
FIG. 13 is a schematic structural diagram of a third crack blocking groove filled with an organic material layer in an embodiment of the present disclosure.

In another embodiment of the present disclosure, referring to FIG. 13, the bottom of the at least one crack blocking groove DAMG is located at the organic substrate BP.

In an embodiment of the present disclosure, the inorganic material layer BIL includes an inorganic blocking layer Barr, an inorganic buffer layer Buff, a gate insulating layer GI, and an interlayer dielectric layer ILD sequentially stacked on a side of the organic substrate BP; and the bottom of the crack blocking groove DAMG is located at the inorganic buffer layer Buff, the inorganic blocking layer Barr or the organic substrate BP.

Optionally, the crack blocking groove DAMG can be obtained by etching the inorganic material layer BIL, and an etching process of the crack blocking groove DAMG can be adjusted according to the process requirements of the display panel PNL. For example, in an embodiment of the present disclosure, the display panel PNL has a bending area in a first peripheral area B1. A part of the inorganic material layer BIL in the bending area needs to be etched to improve the bending ability of the bending area. The inorganic material layer BIL in the bending area can be etched by two etching processes, one etching process, or three or more etching processes. When the inorganic material layer BIL in the bending area is etched, the inorganic material layer BIL outside the inner cut line ICUT may also be etched simultaneously to form the required crack blocking groove DAMG. Note that, in other embodiments of the present disclosure, the formation of the crack blocking groove DAMG may not be synchronized with the etching of the bending area.

As an example, two etching processes (that is, a first etching (EBI, edge bending step A+ILD etch) process and a second etching (EBB, edge bending step B) process) are used for the display panel PNL in the bending area. In the EBI process, the interlayer dielectric layer ILD and the film layer below the interlayer dielectric layer ILD (a side of the interlayer dielectric layer ILD close to the organic substrate BP) can be patterned to form an opening to expose the semiconductor layer; and the preliminary etching is performed on the bending area simultaneously. Referring to FIG. 11, by adjusting a mask, the EBI process can also be used to form crack blocking grooves DAMG, and these crack blocking grooves DAMG can be defined as first crack blocking grooves DAMG1. In the EBB process, the bending area is further etched to further thin or remove the inorganic material layer BIL in the bending area. In this way, the display panel PNL can be bent in the bending area, thereby reducing the border of the display device. Referring to FIG. 12, by adjusting the mask, the EBI process can also be used to form crack blocking grooves DAMG, and these crack blocking grooves DAMG can be defined as second crack blocking grooves DAMG2. Note that, in some embodiments, for some crack blocking grooves DAMG, the EBI process can be firstly used for the preliminary etching, and then the EBB process can be used for the further etching, and the formed crack blocking groove DAMG can be defined as the third crack blocking groove DAMG3 (see FIG. 13).

In some embodiments of the present disclosure, referring to FIGS. 11 to 13, a depth of the first crack blocking groove DAMG1 is smaller than a depth of the second crack blocking groove DAMG2, but bottoms of both the first crack blocking groove DAMG1 and the second crack blocking groove DAMG2 are located at the inorganic buffer layer Buff, or the bottom of the first crack blocking groove DAMG1 is located at the inorganic buffer layer Buff, and the bottom of the second crack blocking groove DAMG2 is located at the inorganic blocking layer Barr. Note that, in some other embodiments, the bottoms of the first crack blocking groove DAMG1 and the second crack blocking groove DAMG2 may also penetrate the inorganic buffer layer Buff and extend into the inorganic blocking layer Barr.

A depth of the third crack blocking groove DAMG3 may be greater than the depths of the first crack blocking groove DAMG1 and the second crack blocking groove DAMG2. In an embodiment of the present disclosure, the third crack blocking groove DAMG3 penetrates the inorganic material layer BIL along a normal direction of the display panel PNL and is located at the organic substrate BP.

In the display panel PNL of the present disclosure, manufacturing processes used for individual crack blocking grooves DAMG may be the same or different, that is, depths of any two crack blocking grooves DAMG may be the same or different.

Figure 14:
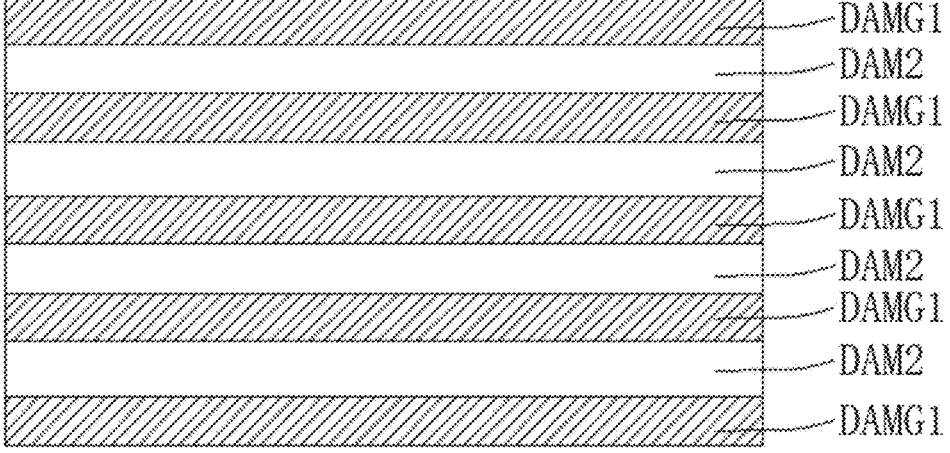
FIG. 14 is a schematic structural diagram of each crack blocking groove being a first crack blocking groove in an embodiment of the present disclosure.

In an example, referring to FIG. 14, each crack blocking groove DAMG is the first crack blocking groove DAMG1, that is, each crack blocking groove DAMG is manufactured in the EBI process.

Figure 15:
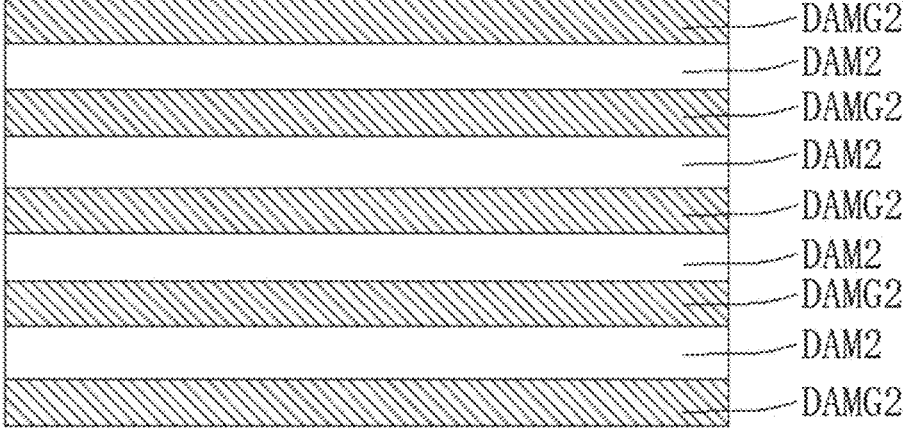
FIG. 15 is a schematic structural diagram of each crack blocking groove being a second crack blocking groove in an embodiment of the present disclosure.

In another example, referring to FIG. 15, each crack blocking groove DAMG is the second crack blocking groove DAMG2, that is, each crack blocking groove DAMG is manufactured in the EBB process.

Figure 16:
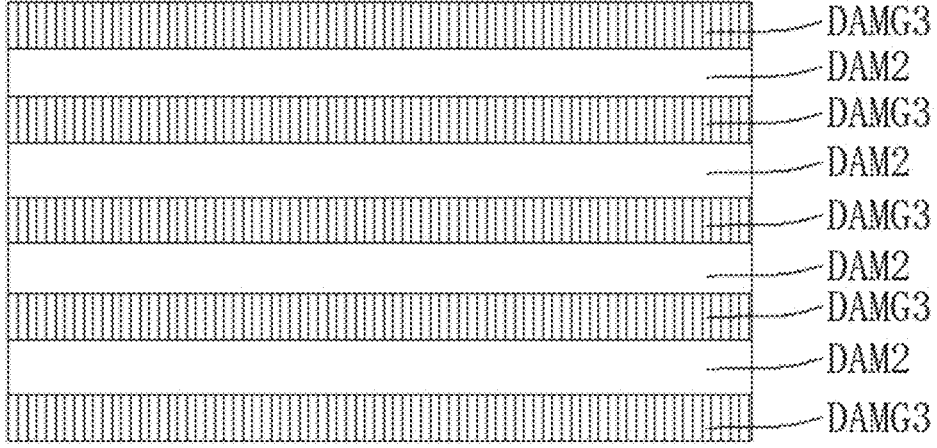
FIG. 16 is a schematic structural diagram of each crack blocking groove being a third crack blocking groove in an embodiment of the present disclosure.

In another example, referring to FIG. 16, each crack blocking groove DAMG is the third crack blocking groove DAMG3, that is, each crack blocking groove DAMG is manufactured by the EBI process plus a peripheral area BBB process.

Figure 17:
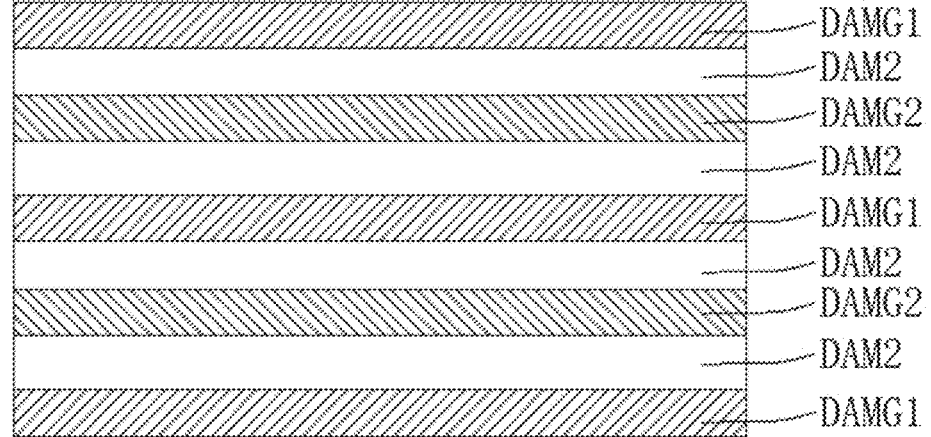
FIG. 17 is a schematic structural diagram of crack blocking grooves being first crack blocking grooves and second crack blocking grooves in an embodiment of the present disclosure.

In another example, referring to FIG. 17, at least part of the crack blocking grooves DAMG is the first crack blocking groove DAMG1, and at least part of the crack blocking groove DAMG is the second crack blocking groove DAMG2, that is, the depths of the two crack blocking grooves DAMG may be the same or different. Further, referring to FIG. 17, along a direction perpendicular to an extension direction of the crack blocking groove DAMG, the first crack blocking groove DAMG1 and the second crack blocking groove DAMG2 are arranged at intervals in sequence.

Note that, the combination form of the crack blocking groove DAMG in the above examples is only an example of the present disclosure, and the crack blocking groove DAMG in the display panel PNL of the present disclosure may also be presented in other combinations, which is not limited by the present disclosure.

In an embodiment of the present disclosure, a width of the second crack dam DAM2 is in a range of 5-15 microns. Note that, in other embodiments of the present disclosure, the width of the second crack dam DAM2 may also be wider or narrower.

In an embodiment of the present disclosure, a width of the crack blocking groove DAMG is in a range of 5-10 microns. Note that, in other embodiments of the present disclosure, the width of the crack blocking groove DAMG may also be wider or narrower.

In an embodiment of the present disclosure, the ratio of the width of the second crack dam DAM2 to the width of the crack blocking groove DAMG is between 0.8 and 1.2. Exemplarily, the ratio of the width of the second crack dam DAM2 to the width of the crack blocking groove DAMG is 1:1.

Embodiments of the present disclosure further provide a display device, which includes any display panel described in the above display panel embodiments. The display device may be a smart phone screen, a smart watch screen or other types of display devices. Since the display device has any one of the display panels described in the above display panel embodiments, it has the same beneficial effect, and the present disclosure will not repeat them here. Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel, comprising a display area and a peripheral area surrounding the display area; wherein the peripheral area comprises an inner cut line surrounding the display area and a first crack dam located at a side of the inner cut line close to the display area, wherein the display panel further comprises an outer cut line located on a side of the inner cut line away from the display area in at least a partial area of the peripheral area; and an end of the outer cut line is intersected with the inner cut line; and the display panel comprises a second crack dam between the outer cut line and the inner cut line.

2. The display panel according to claim 1, wherein the side of the inner cut line away from the display area is provided with an identification mark; and at least part of the identification mark is at least partially disposed within the outer cut line.

3. The display panel according to claim 1, wherein the side of the inner cut line away from the display area is provided with an identification mark; and at least part of the identification mark is located between the outer cut line and the inner cut line, and a width of a part of the outer cut line close to the identification mark is smaller than a width of a remaining part of the outer cut line.

4. The display panel according to claim 2, wherein the second crack dam is disposed between the identification mark and the inner cut line.

5. The display panel according to claim 1, wherein a plurality of second crack dams are provided; and a crack blocking groove is disposed between two adjacent second crack dams, and the crack blocking groove is filled with an organic material.

6. The display panel according to claim 5, wherein the display panel comprises an organic substrate, an inorganic material layer and an organic material layer sequentially stacked in an area where the second crack dams are located; and a bottom of at least one crack blocking groove is located at the inorganic material layer.

7. The display panel according to claim 5, wherein the display panel comprises an organic substrate, an inorganic material layer and an organic material layer sequentially stacked in an area where the second crack dams are located; and a bottom of at least one crack blocking groove is located at the organic substrate.

8. The display panel according to claim 6, wherein the inorganic material layer comprises an inorganic blocking layer, an inorganic buffer layer, a gate insulating layer and an interlayer dielectric layer sequentially stacked on a side of the organic substrate; and a bottom of the crack blocking groove is located at the inorganic buffer layer, the inorganic blocking layer or the organic substrate.

9. The display panel according to claim 1, wherein a number of the second crack dams is in a range of 2-8.

10. The display panel according to claim 1, wherein a width of the second crack dam is in a range of 5-15 microns.

11. The display panel according to claim 5, wherein a width of the crack blocking groove is in a range of 5-10 microns.

12. The display panel according to claim 5, wherein a ratio of a width of the second crack dam to a width of the crack blocking groove is between 0.8 and 1.2.

13. The display panel according to claim 1, wherein the peripheral area comprises a first peripheral area, a second peripheral area, a third peripheral area and a fourth peripheral area that surround the display area and are sequentially coupled end to end; the first peripheral area is disposed opposite to the third peripheral area; and the first peripheral area comprises a bonding pad for bonding an external circuit; and the outer cut line is disposed at the first peripheral area and/or the third peripheral area.

14. The display panel according to claim 1, wherein the display panel comprises a rounded corner; and at least one edge of the rounded corner is partially overlapped with the outer cut line.

15. The display panel according to claim 1, wherein a plurality of outer cut lines are provided and arranged in sequence along a direction away from the display area in at least a partial area; and the second crack dam is disposed between an outer cut line closest to the display area and the inner cut line.

16. The display panel according to claim 1, wherein the display panel is provided with a crack detection trace in the peripheral area; and the crack detection trace is disposed between the first crack dam and the display area.

17. A motherboard structure, comprising a plurality of display panels wherein each display panel comprises a display area and a peripheral area surrounding the display area; wherein the peripheral area comprises an inner cut line surrounding the display area and a first crack dam located at a side of the inner cut line close to the display area; and wherein the motherboard structure comprises a main cut line between the display panels; and an outer cut line is disposed in at least a partial area between the main cut line and the inner cut line of the display panel; an end of the outer cut line is intersected with the inner cut line; and the second crack dam is disposed between the outer cut line and the inner cut line.

18. A display device, comprising a display panel, wherein the display panel comprises a display area and a peripheral area surrounding the display area; wherein the peripheral area comprises an inner cut line surrounding the display area and a first crack dam located at a side of the inner cut line close to the display area, wherein the display panel further comprises an outer cut line located on a side of the inner cut line away from the display area in at least a partial area of the peripheral area; and an end of the outer cut line is intersected with the inner cut line; and the display panel comprises a second crack dam between the outer cut line and the inner cut line.

\* \* \* \* \*